(12) United States Patent
Marriott et al.

(10) Patent No.: US 8,321,601 B2
(45) Date of Patent: *Nov. 27, 2012

(54) AUDIO STATUS INFORMATION FOR A PORTABLE ELECTRONIC DEVICE

(75) Inventors: Greg Marriott, Honolulu, HI (US); Andrew Bert Hodge, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 364 days.

This patent is subject to a terminal disclaimer.

(21) Appl. No.: 12/504,425

(22) Filed: Jul. 16, 2009

(65) Prior Publication Data

US 2009/0278700 A1 Nov. 12, 2009

Related U.S. Application Data

(63) Continuation of application No. 11/209,367, filed on Aug. 22, 2005, now Pat. No. 7,590,772.

(51) Int. Cl.
*G06F 3/00* (2006.01)
*G06F 1/00* (2006.01)

(52) U.S. Cl. .......................... 710/15; 713/340

(58) Field of Classification Search .................... 710/15, 710/18, 19; 713/340
See application file for complete search history.

(56) References Cited

U.S. PATENT DOCUMENTS

| | | |
|---|---|---|
| 4,090,216 A | 5/1978 | Constable |
| 4,386,345 A | 5/1983 | Narveson et al. |
| 4,451,849 A | 5/1984 | Fuhrer |
| 4,589,022 A | 5/1986 | Prince et al. |
| 4,928,307 A | 5/1990 | Lynn |
| 5,406,305 A | 4/1995 | Shimomura et al. |
| 5,442,598 A | 8/1995 | Kaikawa et al. |
| 5,559,945 A | 9/1996 | Beaudet et al. |
| 5,583,993 A | 12/1996 | Foster et al. |
| 5,596,260 A | 1/1997 | Moravec et al. |
| 5,608,698 A | 3/1997 | Yamanoi et al. |
| 5,616,876 A | 4/1997 | Cluts |
| 5,617,386 A | 4/1997 | Choi |
| 5,670,985 A | 9/1997 | Cappels, Sr. et al. |
| 5,684,513 A | 11/1997 | Decker |
| 5,710,922 A | 1/1998 | Alley et al. |
| 5,712,949 A | 1/1998 | Kato et al. |
| 5,721,949 A | 2/1998 | Smith et al. |

(Continued)

FOREIGN PATENT DOCUMENTS

DE 43 34 773 A1 4/1994

(Continued)

OTHER PUBLICATIONS

Matsuzawa, Low-Voltage and Low-power Circuit Design for Mixed Analog/Digital Systems in Portable Equipment, Apr. 1994, IEEE, vol. 29, No. 4, pp. 1-11.*

(Continued)

*Primary Examiner* — Ernest Unelus
(74) *Attorney, Agent, or Firm* — Morgan, Lewis & Bockius LLP

(57) ABSTRACT

Improved techniques for providing status information associated with an electronic device to its user in an audible manner are disclosed. The status information can pertain to one or more conditions of the electronic device. The conditions can vary depending on the nature of the electronic device. As an example, where the electronic device is battery powered, one condition of the electronic device that can be monitored is a battery charge level.

19 Claims, 9 Drawing Sheets

U.S. PATENT DOCUMENTS

| | | | |
|---|---|---|---|
| 5,726,672 A | 3/1998 | Hernandez et al. | |
| 5,739,451 A | 4/1998 | Winksy et al. | |
| 5,740,143 A | 4/1998 | Suetomi | |
| 5,815,225 A | 9/1998 | Nelson | |
| 5,822,288 A | 10/1998 | Shinada | |
| 5,835,721 A | 11/1998 | Donahue et al. | |
| 5,835,732 A | 11/1998 | Kikinis et al. | |
| 5,864,868 A | 1/1999 | Contois | |
| 5,870,710 A | 2/1999 | Ozawa et al. | |
| 5,918,303 A | 6/1999 | Yamaura et al. | |
| 5,923,757 A | 7/1999 | Hocker et al. | |
| 5,952,992 A | 9/1999 | Helms | |
| 5,982,902 A | 11/1999 | Terano | |
| 5,995,460 A | 11/1999 | Takagi et al. | |
| 5,998,972 A | 12/1999 | Gong | |
| 6,006,274 A | 12/1999 | Hawkins et al. | |
| 6,009,237 A | 12/1999 | Hirabayashi et al. | |
| 6,011,585 A | 1/2000 | Anderson | |
| 6,018,705 A | 1/2000 | Gaudet et al. | |
| 6,041,023 A | 3/2000 | Lakhansingh | |
| 6,052,654 A | 4/2000 | Gaudet et al. | |
| 6,122,340 A | 9/2000 | Darley et al. | |
| 6,161,944 A | 12/2000 | Leman | |
| 6,172,948 B1 | 1/2001 | Keller et al. | |
| 6,179,432 B1 | 1/2001 | Zhang et al. | |
| 6,191,939 B1 | 2/2001 | Burnett | |
| 6,208,044 B1 | 3/2001 | Viswanadham et al. | |
| 6,216,131 B1 | 4/2001 | Liu et al. | |
| 6,217,183 B1 | 4/2001 | Shipman | |
| 6,222,347 B1 | 4/2001 | Gong | |
| 6,248,946 B1 | 6/2001 | Dwek | |
| 6,295,541 B1 | 9/2001 | Bodnar et al. | |
| 6,298,314 B1 | 10/2001 | Blackadar et al. | |
| 6,332,175 B1 | 12/2001 | Birrell et al. | |
| 6,336,365 B1 | 1/2002 | Blackadar et al. | |
| 6,336,727 B1 | 1/2002 | Kim | |
| 6,341,316 B1 | 1/2002 | Kloba et al. | |
| 6,357,147 B1 | 3/2002 | Darley et al. | |
| 6,377,530 B1 | 4/2002 | Burrows | |
| 6,467,924 B2 | 10/2002 | Shipman | |
| 6,493,652 B1 | 12/2002 | Ohlenbusch et al. | |
| 6,536,139 B2 | 3/2003 | Darley et al. | |
| 6,549,497 B2 | 4/2003 | Miyamoto et al. | |
| 6,560,903 B1 | 5/2003 | Darley | |
| 6,587,403 B1 | 7/2003 | Keller et al. | |
| 6,587,404 B1 | 7/2003 | Keller et al. | |
| 6,611,789 B1 | 8/2003 | Darley | |
| 6,621,768 B1 | 9/2003 | Keller et al. | |
| 6,658,577 B2 | 12/2003 | Huppi et al. | |
| 6,731,312 B2 | 5/2004 | Robbin | |
| 6,762,741 B2 | 7/2004 | Weindorf | |
| 6,794,566 B2 | 9/2004 | Pachet | |
| 6,799,226 B1 | 9/2004 | Robbin et al. | |
| 6,801,964 B1 | 10/2004 | Mahdavi | |
| 6,870,529 B1 | 3/2005 | Davis | |
| 6,876,947 B1 | 4/2005 | Darley et al. | |
| 6,882,955 B1 | 4/2005 | Ohlenbusch et al. | |
| 6,898,550 B1 | 5/2005 | Blackadar et al. | |
| 6,911,971 B2 | 6/2005 | Suzuki et al. | |
| 6,918,677 B2 | 7/2005 | Shipman | |
| 6,934,812 B1 | 8/2005 | Robbin et al. | |
| 6,950,087 B2 | 9/2005 | Knox et al. | |
| 7,046,230 B2 | 5/2006 | Zadesky | |
| 7,062,225 B2 | 6/2006 | White | |
| 7,084,856 B2 | 8/2006 | Huppi | |
| 7,146,437 B2 | 12/2006 | Robbin et al. | |
| 7,234,026 B2 | 6/2007 | Robbin et al. | |
| 7,505,795 B1* | 3/2009 | Lim et al. | 455/574 |
| 2001/0041021 A1 | 11/2001 | Boyle et al. | |
| 2001/0042107 A1 | 11/2001 | Palm | |
| 2002/0002413 A1 | 1/2002 | Tokue | |
| 2002/0013784 A1 | 1/2002 | Swanson | |
| 2002/0045961 A1 | 4/2002 | Gibbs et al. | |
| 2002/0046315 A1 | 4/2002 | Miller et al. | |
| 2002/0055934 A1 | 5/2002 | Lipscomb et al. | |
| 2002/0116082 A1 | 8/2002 | Gudorf | |
| 2002/0152045 A1 | 10/2002 | Dowling et al. | |
| 2002/0161865 A1 | 10/2002 | Nguyen | |
| 2002/0173273 A1 | 11/2002 | Spurgat et al. | |
| 2002/0189426 A1 | 12/2002 | Hirade et al. | |
| 2003/0037254 A1 | 2/2003 | Fischer et al. | |
| 2003/0046434 A1 | 3/2003 | Flanagin et al. | |
| 2003/0074457 A1 | 4/2003 | Kluth | |
| 2003/0076301 A1 | 4/2003 | Tsuk et al. | |
| 2003/0079038 A1 | 4/2003 | Robbin et al. | |
| 2003/0095096 A1 | 5/2003 | Robbin et al. | |
| 2003/0097379 A1 | 5/2003 | Ireton | |
| 2003/0133694 A1 | 7/2003 | Yeo | |
| 2003/0160702 A1* | 8/2003 | Tanaka | 340/693.3 |
| 2003/0167318 A1 | 9/2003 | Robbin et al. | |
| 2003/0229490 A1 | 12/2003 | Etter | |
| 2004/0001395 A1 | 1/2004 | Keller et al. | |
| 2004/0001396 A1 | 1/2004 | Keller et al. | |
| 2004/0012556 A1 | 1/2004 | Yong et al. | |
| 2004/0055446 A1 | 3/2004 | Robbin et al. | |
| 2004/0069122 A1 | 4/2004 | Wilson | |
| 2004/0076086 A1 | 4/2004 | Keller | |
| 2004/0086120 A1 | 5/2004 | Akins, III et al. | |
| 2004/0094018 A1 | 5/2004 | Ueshima et al. | |
| 2004/0198436 A1 | 10/2004 | Alden | |
| 2004/0224638 A1 | 11/2004 | Fadell et al. | |
| 2004/0242286 A1* | 12/2004 | Benco et al. | 455/574 |
| 2004/0252966 A1* | 12/2004 | Holloway et al. | 386/46 |
| 2004/0267825 A1 | 12/2004 | Novak et al. | |
| 2005/0015254 A1 | 1/2005 | Beaman | |
| 2005/0030175 A1 | 2/2005 | Wolfe | |
| 2005/0166153 A1 | 7/2005 | Eytchison et al. | |
| 2006/0013414 A1 | 1/2006 | Shih | |
| 2006/0187073 A1* | 8/2006 | Lin et al. | 340/636.15 |
| 2006/0190577 A1 | 8/2006 | Yamada | |
| 2006/0195206 A1 | 8/2006 | Moon et al. | |
| 2006/0197755 A1 | 9/2006 | Bawany | |
| 2006/0221788 A1 | 10/2006 | Lindahl et al. | |
| 2006/0265503 A1 | 11/2006 | Jones et al. | |
| 2006/0274905 A1 | 12/2006 | Lindahl et al. | |
| 2007/0028009 A1 | 2/2007 | Robbin et al. | |
| 2007/0185551 A1 | 8/2007 | Meadows et al. | |
| 2008/0046948 A1 | 2/2008 | Verosub | |
| 2009/0241760 A1* | 10/2009 | Georges | 84/645 |

FOREIGN PATENT DOCUMENTS

| | | |
|---|---|---|
| DE | 44 45 023 A1 | 6/1996 |
| EP | 0578604 | 1/1994 |
| EP | 0863469 | 9/1998 |
| EP | 0917077 | 5/1999 |
| EP | 0982732 | 3/2000 |
| EP | 1028425 | 8/2000 |
| EP | 1028426 A2 | 8/2000 |
| EP | 1076302 | 2/2001 |
| EP | 1536612 | 6/2005 |
| EP | 1566948 | 8/2005 |
| GB | 2384399 | 7/2003 |
| WO | WO01/33569 | 6/1995 |
| WO | WO95/16950 | 6/1995 |
| WO | WO00/22820 | 4/2000 |
| WO | WO01/65413 | 9/2001 |
| WO | WO01/67753 | 9/2001 |
| WO | WO02/25610 | 3/2002 |
| WO | WO03/023786 | 3/2003 |
| WO | WO03/067202 | 8/2003 |
| WO | WO2004/055637 | 7/2004 |
| WO | WO2004/061850 A1 | 7/2004 |
| WO | WO2004/084413 A2 | 9/2004 |
| WO | WO2005/031737 | 4/2005 |
| WO | WO2005/008505 | 7/2005 |

OTHER PUBLICATIONS

Office Action dated Oct. 10, 2011 in U.S. Appl. No. 11/144,541.
Office Action dated Feb. 9, 2012 in U.S. Appl. No. 11/144,541.
"Apple Announces iTunes 2," Press Release, Apple Computer, Inc., Oct. 23, 2001.
"Apple Introduces iTunes—World's Best and Easiest to Use Jukebox Software," Macworld Expo, San Francisco, Jan. 9, 2001.
"Apple's iPod Available in Stores Tomorrow," Press Release, Apple Computer, Inc., Nov. 9, 2001.

"Nomad Jukebox," User Guide, Creative Technology Ltd., Version 1, Aug. 2000.

"SoundJam MP Plus Manual, version 2.0"—MP3 Player and Encoder for Macintosh by Jeffrey Robbin, Bill Kincaid and Dave Heller, manual by Tom Negrino, published by Casady & Greene, Inc., 2000.

"12.1" 925 Candela Mobile PC", downloaded from LCDHardware.com on Dec. 19, 2002, http://www.lcdharware.com/panel/12_1_panel/default.asp.

"BL82 Series Backlit Keyboards", www.tg3electronics.com/products/backlit/backlit.htm, downloaded Dec. 19, 2002.

"Bluetooth PC Headsets—Enjoy Wireless VoIP Conversations: 'Connecting' Your Bluetooth Headset With Your Computer", Bluetooth PC Headsets; downloaded on Apr. 29, 2006 from http://www.bluetoothpcheadsets.com/connect.htm.

"Creative MuVo TX 256 MB," T3 Magazine, Aug. 17, 2004, http://www.t3.co.uk/reviews/entertainment/mp3_player/creative_muvo_tx_256mb [downloaded Jun. 6, 2006].

"Digital Still Cameras—Downloading Images to a Computer," Mimi Chakarova et al., Multi-Media Reporting and Convergence, 2 pgs, Jan. 18, 2006.

"Eluminx Illuminated Keyboard", downloaded Dec. 19, 2002, http://www.elumix.com/.

"How to Pair a Bluetooth Headset & Cell Phone", About.com; downloaded on Apr. 29, 2006 from http://mobileoffice.about.com/od/usingyourphone/ht/blueheadset_p.htm.

"Peripherals for Industrial Keyboards & Pointing Devices", Stealth Computer Corporation, downloaded on Dec. 19, 2002, http://www.stealthcomputer.com/peropherals_oem.htm.

"Poly-Optical Fiber Optic Membrane Switch Backlighting", downloaded Dec. 19, 2002, http://www.poly-optical.com/membrane_switches.html.

"Public Safety Technologies Tracer 2000 Computer", downloaded Dec. 19, 2002, http://www.pst911.com/traver.html.

"QuickTime Movie Playback Programming Guide", Apple Computer, Inc., Aug. 11, 2005.

"QuickTime Overview", Apple Computer, Inc., Aug. 11, 2005.

"Rocky Matrix Backlit Keyboard", downloaded Dec. 19, 2002, http://www.amrel.com/asi_matrixkeyboard.html.

"Sony Ericsson to introduce Auto pairing to improve Bluetooth connectivity between headsets and phones", Sep. 28, 2005 Press Release, Sony Ericsson Corporate; downloaded on Apr. 29, 2006 from http://www.sonyericsson.com/spg.jsp?cc=global&1c=en&ver=4001&template=pc3_1_1&z....

"Taos, Inc., Announces Industry's First Ambient Light Sensor to Convert Light Intensity to Digital Signals", www.taosinc.com/pressrelease_090902.htm, downloaded Jan. 23, 2003.

"Toughbook 28: Powerful, Rugged and Wireless", Panasonic: Toughbook Models, downloaded Dec. 19, 2002, http:www.panasonic.com/computer/notebook/html/01a_s8.htm.

"When it Comes to Selecting a Projection TV, Toshiba Makes Everything Perfectly Clear, Previews of New Releases", www.bestbuy.com/HomeAudioVideo/Specials/ToshibaTVFeatures.asp, downloaded Jan. 23, 2003.

"WhyBuy: Think Pad", IBM ThinkPad Web Page Ease of Use, downloaded on Dec. 19, 2002, http://www.pc.ibm.com/us/thinkpad/easeofuse.html.

512MB Waterproof MP3 Player with FM Radio & Built-in Pedometer, Oregon Scientific, downloaded on Jul. 31, 2006 from http://www2.oregonscientific.com/shop/product.asp?cid=4&scid=11&pid=581.

Adam C. Engst, "SoundJam Keeps on Jammin'," Jun. 19, 2000, http://db.tidbits.com/getbits.acgi?tbart=05988.

Alex Veiga, "AT&T Wireless Launching Music Service," Yahoo! Finance, Oct. 5, 2004, pp. 1-2.

Andrew Birrell, "Personal Jukebox (PJB)," Oct. 13, 2000, http://birrell.org/andrew/talks/pjb-overview.ppt.

Apple iPod Technical Specifications, iPod 20GB and 60GB Mac + PC, downloaded from http://www.apple.com/ipod/color/specs.html on Aug. 8, 2005.

Bociurkiw, Michael, "Product Guide: Vanessa Matz,", www.forbes.com/asap/2000/1127/vmartz_print.html, Nov. 27, 2000.

Compaq, "Personal Jukebox," Jan. 24, 2001, http://research.compaq.com/SRC/pjb/.

Creative: "Creative NOMAD MuVo TX," www.creative.com, Nov. 1, 2004, http://web.archive.org/web/20041024175952/www.creative.com/products/pfriendly.asp?product=9672 [downloaded Jun. 6, 2006].

Creative: "Creative NOMAD MuVo," www.creative.com, Nov. 1, 2004, http://web.archive.org/web/20041024075901/www.creative.com/products/product.asp?category=213&subcategory=215&product=110 [downloaded Jun. 7, 2006].

Creative: "MP3 Player," www.creative.com, Nov. 1, 2004, http://web.archive.org/web/20041024074823/www.creative.com/products/product.asp?category=213&subcategory=216&product=4983 [downloaded Jun. 7, 2006].

De Herrera, Chris, "Microsoft ActiveSync 3.1," Version 1.02, Oct. 13, 2000.

iAP Sports Lingo 0x09 Protocol V1.00, May 1, 2006.

IEEE 1394—Wikipedia, 1995, http://www.wikipedia.org/wiki/Firewire.

International Search Report dated Feb. 4, 2003 in corresponding application No. PCT/US2002/033330.

International Search Report dated Jul. 10, 2007 in corresponding application No. PCT/US2006/048738.

International Search Report dated Apr. 5, 2006 from corresponding International Application No. PCT/US2005/038819.

International Search Report dated Jul. 2, 2007 in related case PCT/US2006/048669.

International Search Report dated Jun. 19, 2007 in related Application PCT/US2006/048753.

International Search Report dated May 21, 2007 from corresponding PCT Application No. PCT/US2006/048670.

International Search Report dated Nov. 24, 2006 in PCT Application No. PCT/US2005/046797.

International Search Report in corresponding European Application No. 06256215.2 dated Feb. 20, 2007.

Invitation to Pay Additional Fees and Partial Search Report for corresponding PCT Application No. PCT/US2005/046797 dated Jul. 3, 2006.

iTunes 2, Playlist Related Help Screens, iTunes v2.0, Apple Computer, Inc., Oct. 23, 2001.

iTunes, Playlist Related Help Screens, iTunes v1.0, Apple Computer, Inc., Jan. 2001.

Jabra Bluetooth Headset User Manual; GN Netcom A/s, 2005.

Jabra Bluetooth Introduction; GN Netcom A/S, Oct. 2004.

Jabra FreeSpeak BT200 User Manual; Jabra Corporation, 2002.

Kennedy, "Digital Data Storage Using Video Disc," IBM Technical Disclosure Bulletin, vol. 24, No. 2, Jul. 1981.

Miniman, "Applian Software's Replay Radio and Player v1.02," Product review, pocketnow.com, http://www.pocketnow.com/reviews/replay/replay.htm, Jul. 31, 2001.

Musicmatch, "Musicmatch and Xing Technology Introduce Musicmatch Jukebox," May 18, 1998, http://www.musicmatch.com/info/company/press/releases/?year=1998&release=2.

Nonhoff-Arps, et al., "Straβenmusik Portable MP3-Spieler mit USB-Anschluss," CT Magazin Fuer Computer Technik, Verlag Heinz Heise GmbH, Hannover DE, No. 25, Dec. 4, 2000.

Personal Jukebox (PJB), "Systems Research Center and PAAD," Compaq Computer Corp., Oct. 13, 2000, http://research.compaq.com/SRC/pjb/.

Peter Lewis, "Two New Ways to Buy Your Bits," CNN Money, Dec. 31, 2003, pp. 1-4.

Sastry, Ravindra Wadali. "A Need for Speed: A New Speedometer for Runners", submitted to the Department of Electrical Engineering and Computer Science at the Massachusetts Institute of Technology, May 28, 1999.

Sinitsyn, Alexander. "A Synchronization Framework for Personal Mobile Servers," Pervasice Computing and Communications Workshops, 2004. Proceedings of the Second IEEE Annual Conference on, Piscataway, NJ, USA, IEEE, Mar. 14, 2004, pp. 208-212.

SoundJam MP Plus, Representative Screens, published by Casady & Greene, Inc., Salinas, CA, 2000.

Specification Sheet, iTunes 2, Apple Computer, Inc., Oct. 31, 2001.

Spiller, Karen. "Low-decibel earbuds keep noise at a reasonable level", The Telegraph Online, dated Aug. 13, 2006, http://www.nashuatelegraph.com/apps/pbcs.dll/article?Date=20060813&Cate.. Downloaded Aug. 16, 2006.

Steinberg, "Sonicblue Rio Car," Product Review, Dec. 12, 2000, http://electronics.cnet.com/electronics/0-6342420-1304-4098389.html.

Travis Butler, "Archos Jukebox 6000 Challenges Nomad Jukebox," Aug. 13, 2001, http://db.tidbits.com/getbits.acgi?tbart=06521.

Travis Butler, "Portable MP3: The Nomad Jukebox," Jan. 8, 2001, http://db.tidbits.com/getbits.acgi?tbart=06261.

U.S. Appl. No. 10/125,893, filed Apr. 18, 2002 and titled "Power Adapters for Powering and/or Charging Peripheral Devices."

Waterproof Music Player with FM Radio and Pedometer User Manual, Oregon Scientific, 2005.

Written Opinion of the International Searching Authority dated Nov. 24, 2006 in PCT Application No. PCT/US2005/046797.

Notice of Allowance dated Apr. 21, 2009 in U.S. Appl. No. 11/209,367.

Office Action dated Oct. 9, 2007 from U.S. Appl. No. 11/209,367.

Office Action dated Apr. 15, 2008 from U.S. Appl. No. 11/209,367.

Office Action dated Aug. 7, 2008 from U.S. Appl. No. 11/209,367.

* cited by examiner

AUDIO STATUS INFORMATION FOR A PORTABLE ELECTRONIC DEVICE

CROSS-REFERENCE TO RELATED APPLICATIONS

This application is a Continuation of U.S. patent application Ser. No. 11/209,367 filed Aug. 22, 2005 entitled "AUDIO STATUS INFORMATION FOR A PORTABLE ELECTRONIC DEVICE", which is hereby incorporated by reference herein and from which priority under 35 U.S.C. §120 is claimed.

This application is related to U.S. patent application Ser. No. 11/144,541, filed Jun. 3, 2005, and entitled "TECHNIQUES FOR PRESENTING SOUND EFFECTS ON A PORTABLE MEDIA PLAYER", which is hereby incorporated herein by reference.

BACKGROUND OF THE INVENTION

1. Field of the Invention

The present invention relates to portable electronic devices and, more particularly, to providing status information on a portable electronic device.

2. Description of the Related Art

Conventionally, portable electronic devices, such as cellular phones, portable digital assistants or portable media players, have provided visual clues regarding certain device status conditions. For example, battery-powered portable electronic devices frequently display a visual indication of battery status. The visual indication typically indicates the extent to which the battery is charged (i.e., battery level). Additionally, cellular phones can not only provide such a visual indication of battery level but also provide an auditory, periodic beeping sound during a call in process to alert the user when battery level is particularly low.

Unfortunately, however, users often interact with media players while wearing earphones or headphones. For example, users might also use the media player to listen to audio sounds via the earphones or headphones. In such cases, the users will likely not be able or interested to view a display screen that displays a visual indication of battery level. Still further, some portable media players do not even include a display screen. Consequently, any device status being displayed will conventionally not likely be received by the user of the media player.

Thus, there is a need for improved techniques to inform users about device status of portable media players.

SUMMARY OF THE INVENTION

The invention pertains to providing status information for an electronic device to its user in an audible manner. The status information can pertain to one or more conditions of the electronic device. The conditions can vary depending on the nature of the electronic device. As an example, where the electronic device is battery powered, one condition of the electronic device that can be monitored is a battery charge level. The audio output of status information can be output to an audio output device, such as a speaker.

The invention can be implemented in numerous ways, including as a method, system, device, apparatus (including graphical user interface), or computer readable medium. Several embodiments of the invention are discussed below.

As a method for providing an indication of battery status to a user of a portable audio output device having a battery, one embodiment of the invention includes at least the acts of: monitoring a battery charge level; obtaining an audio snippet based on the battery charge level; and outputting the audio snippet for the user.

As a portable media device, one embodiment of the invention includes at least an audio output device; an electronic device used by the portable media player; a device status monitor that monitors a device status of the electronic device; and a device status manager operatively connected to the device status monitor. The device status monitor determines when the device status of the electronic device is to be output to the audio output device.

As a graphical user interface for a media device adapted to provide auditory device status feedback, one embodiment of the invention includes at least: a list of device status feedback options; and a visual indicator that indicates a selected one of the device status feedback options, wherein the media device provides auditory device status feedback in accordance with the selected one of the device status feedback options.

As a computer readable medium including at least computer program code for providing an indication of device status to a user of a portable audio output device having an internal device, one embodiment of the invention includes at least: computer program code for monitoring a device status of the internal device; computer program code for obtaining an audio snippet based on the device status; and computer program code for outputting the audio snippet for the user.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention pertains to providing status information for an electronic device to its user in an audible manner. The status information can pertain to one or more conditions of the electronic device. The conditions can vary depending on the nature of the electronic device. As an example, where the electronic device is battery powered, one condition of the electronic device that can be monitored is a battery charge level. The audio output of status information can be output to an audio output device, such as a speaker.

The invention is particularly well suited for a portable electronic device. The ability to provide a user with status information in an audible manner avoids the need for a user to view a display screen to obtain status information. Further, status information can also be provided even if the electronic device does not have a display screen.

The improved techniques are also well suited for use with portable electronic devices having audio playback capabilities, such as portable media devices (e.g., digital music player or MP3 player). Portable media devices can store and play audio sounds pertaining to media assets (media items), such as music, audiobooks, meeting recordings, and other speech or voice recordings. Portable media devices, such as media players, are small and highly portable and have limited processing resources. Often, portable media devices are hand-held media devices, such as hand-held audio players, which can be easily held by and within a single hand of a user.

Embodiments of the invention are discussed below with reference to FIGS. 1-8. However, those skilled in the art will readily appreciate that the detailed description given herein with respect to these figures is for explanatory purposes as the invention extends beyond these limited embodiments.

Figure 1:
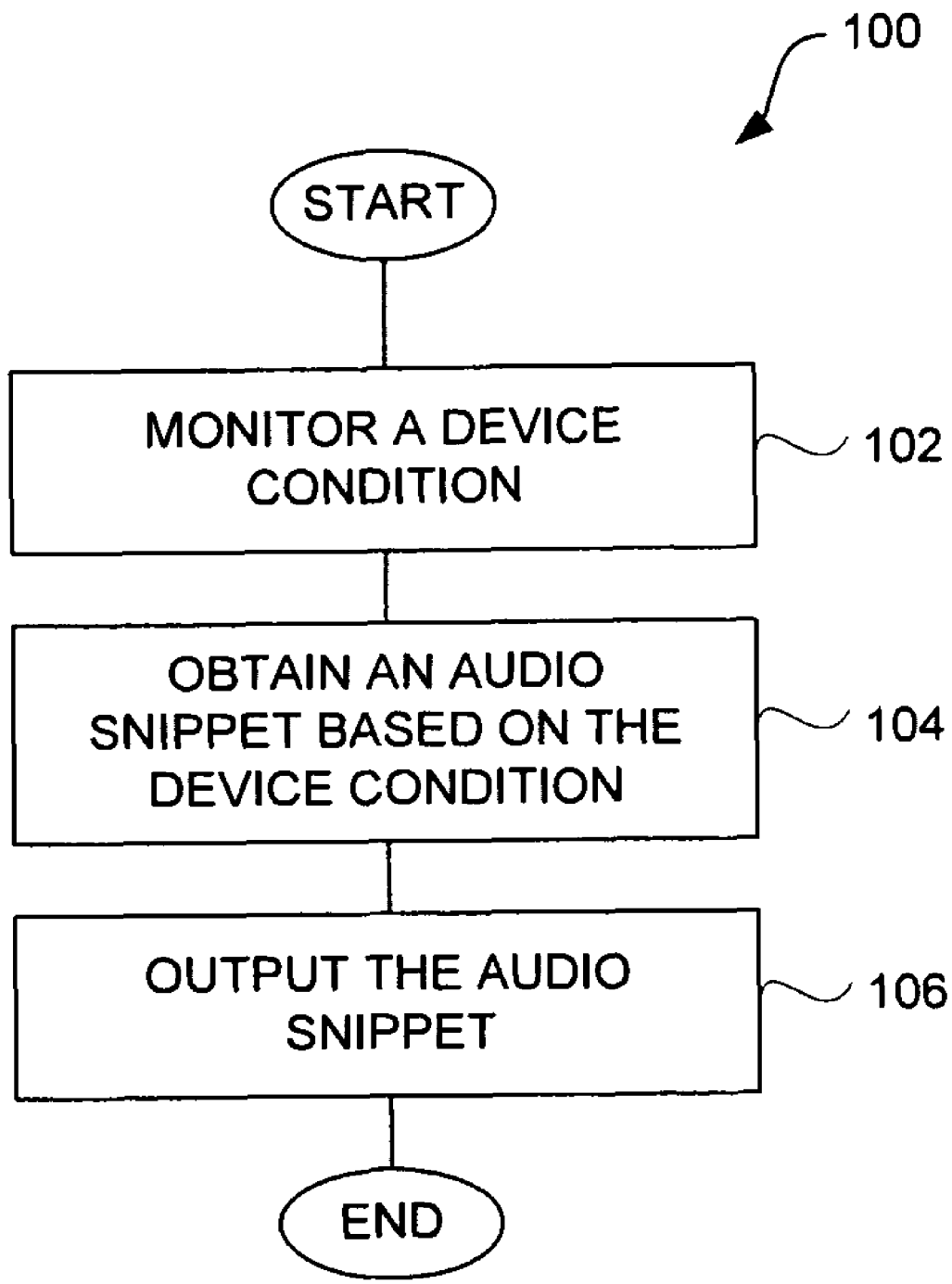
FIG. 1 is a flow diagram of a device condition monitoring process according to one embodiment of the invention.

FIG. 1 is a flow diagram of a device condition monitoring process 100 according to one embodiment of the invention. The device condition monitoring process 100 operates on an electronic device and serves to inform its user of a condition of a device of the electronic device. In particular, the device condition monitoring process 100 monitors 102 device condition. Then, an audio snippet is obtained 104 based on the device condition. In other words, the audio snippet being obtained 104 is dependent on the device condition. In one implementation, the audio snippet can be obtained 104 from memory storage of the memory device. In another implementation, the audio snippet can be obtained 104 by generating the audio snippet at the electronic device as needed. After the audio snippet has been obtained 104, the audio snippet is output 106. The audio snippet being output 106 is an audio output (i.e., audio sound). The audio output can be output using an audio output device, such as a speaker, that is associated with the electronic device. For example, the speaker can be internal to the electronic device or external to the electronic device. Examples of an external speaker include a headset, headphone(s) or earphone(s) that can be coupled to the electronic device. Following the block 106, the device condition monitoring process 100 is complete and ends.

The device conditions being monitored by the device condition monitoring process 100 can vary. In one embodiment, the device condition being monitored by the device condition monitoring process 100 is a battery charge level of a battery of the electronic device. In which case, the device condition monitoring process 100 operates on the electronic device, such as a battery-powered electronic device, and serves to inform its user of a condition of its battery, namely, the battery charge level of the battery.

In one embodiment, the audio output provides device status information, e.g., battery charge level information, to the user of the electronic device in an audible manner. Advantageously, the user of the electronic device is able to acquire status information without having to view a display screen. This can be important when the electronic device lacks a display screen or when the user would be unable to conveniently view the display screen should a display screen be provided.

Figure 2A:
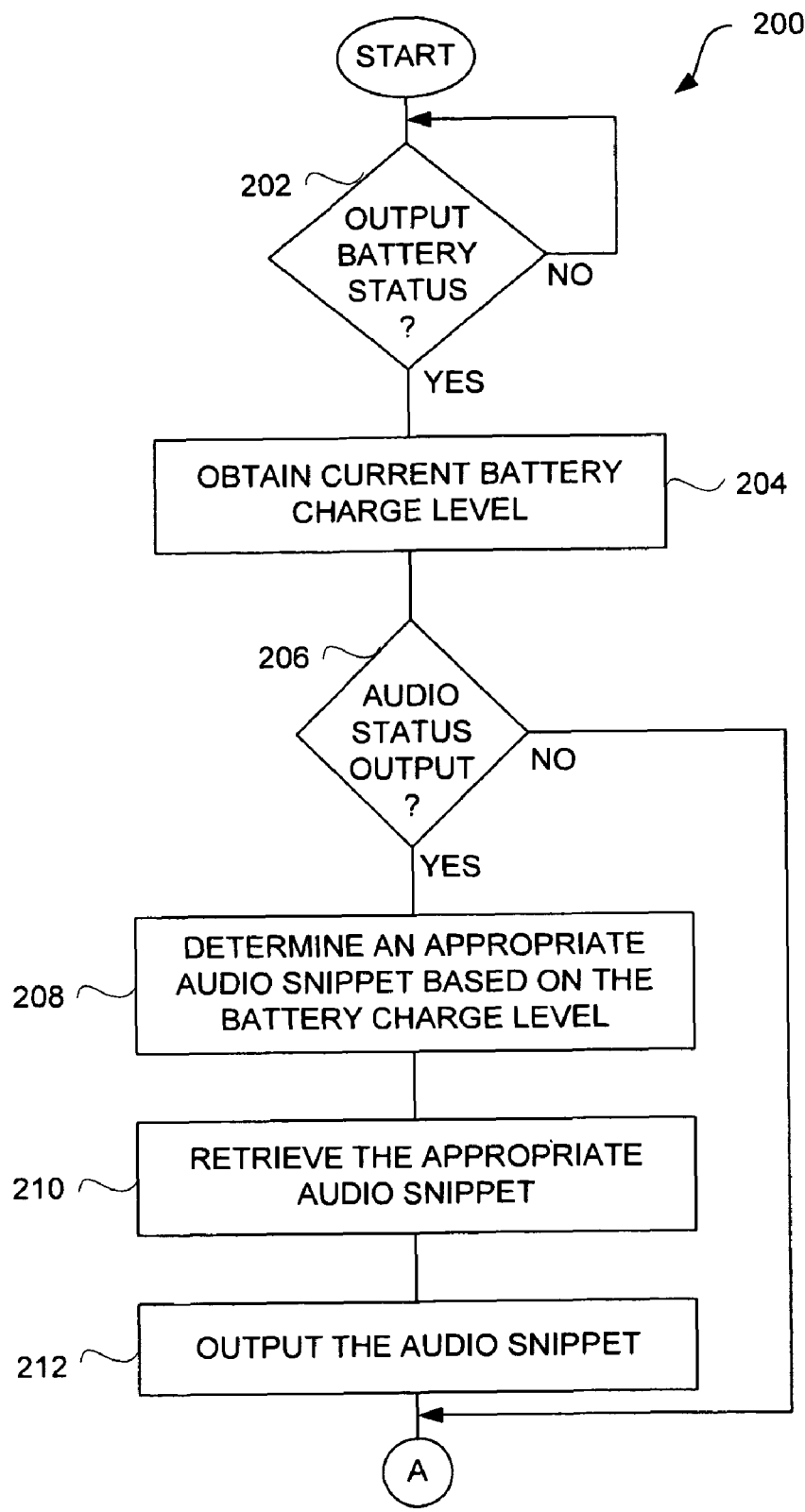
FIGS. 2A and 2B are flow diagrams of a battery charge monitoring process according to one embodiment of the invention.
Figure 2B:
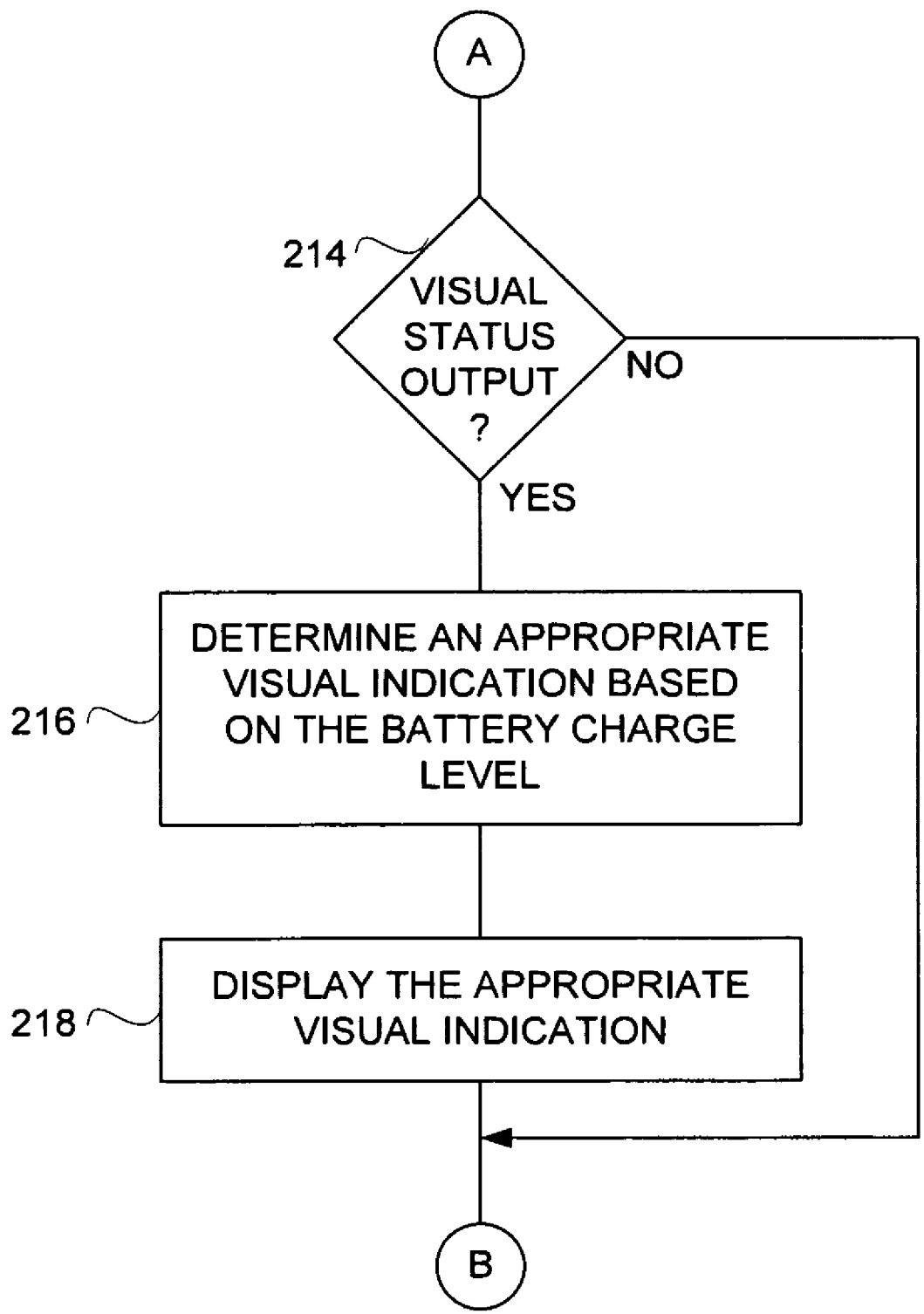

FIGS. 2A and 2B are flow diagrams of a battery charge monitoring process 200 according to one embodiment of the invention. The battery charge monitoring process 200 is, for example, performed by an electronic device having battery charge monitoring capabilities.

The battery charge monitoring process 200 begins with a decision 202 that determines whether battery status is to be output. When the decision 202 determines that battery status is not to be output, then the battery charge monitoring process 202 waits until there is a need to output battery status. In other words, the battery charge monitoring process 200 is effectively invoked when battery status is to be output. As one example, a user of the electronic device can request battery status be output. In another example, the electronic device can itself request battery status be output. When the decision 202 determines that battery status is to be output, a current battery charge level is obtained 204.

In this embodiment, the battery status can be output as an audio status output, a visual status output, or both. Hence, a decision 206 then determines whether an audio status output is to be provided. When the decision 206 determines that an audio status output is to be provided, an appropriate audio snippet is determined 208 based on the battery charge level. Next, the appropriate audio snippet is retrieved 210. In one implementation, a plurality of different audio snippets are available at the electronic device, and the appropriate one of the audio snippets can be selected and retrieved.

The audio snippet is then output 212. The output of the audio snippet produces an audio output at one or more speakers. The audio output can be output using a speaker that is associated with the electronic device. For example, the speaker can be internal to the electronic device or external to the electronic device. Examples of an external speaker include a headset, headphones) or earphones) that can be coupled to the electronic device. The audio output thus informs the user of the electronic device of the status of the battery.

Note that in one embodiment of the invention, the electronic device is a media player, such as a music player. When the media player is playing media for the benefit of its user, the audio output being produced to provide the user with status information recording the battery can be mixed with any other audio output being provided by the media player. For example, if the media player is playing a song, the audio output for the battery status can be mixed with the audio output for the song. Additionally, for improved mixing, fade-in and fade-out techniques can be utilized.

Alternatively, when the decision 206 determines that the audio status is not to be output, blocks 208 through 212 are bypassed. Following the block 212, or its being bypassed, a decision 214 determines whether a visual status is to be provided. When the decision 214 determines that a visual status is to be provided, an appropriate visual indication is determined 216 based on the battery charge level. Then, the appropriate visual indication is displayed 218. The visual indication can be presented on a display screen of the electronic device, if one is provided, or by some other light source (e.g., Light-Emitting Diode (LED)). On the other hand, when the decision 214 determines that a visual status is not to be provided, blocks 216 and 218 are bypassed.

Following the block 218, or its being bypassed, the battery charge monitoring process 200 ends. However, the battery charge monitoring process 200 is typically activated on user request or device request.

Figure 3:
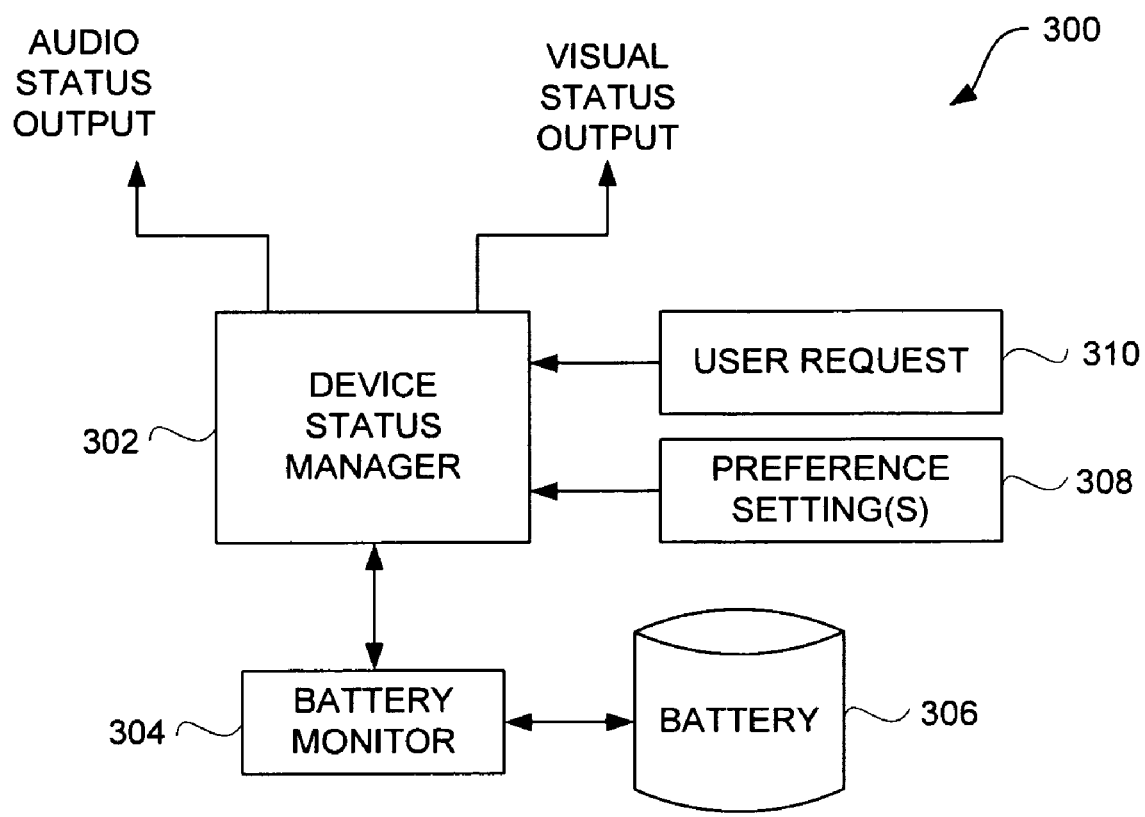
FIG. 3 is a block diagram of a device status monitoring system according to one embodiment of the invention.

FIG. 3 is a block diagram of a device status monitoring system 300 according to one embodiment of the invention. The device status monitoring system 300 is internal to an electronic device. Hence, the device status monitoring system 300 serves to monitor one or more devices that are internal to the electronic device. In this embodiment the device being monitored is a battery. Therefore, in one implementation, the device status monitoring system 300 can be referred to as a battery status monitoring system 300.

The device status monitoring system 300 includes a device status manager 302 that manages acquisition, storage and output of device status information. The device status manager 302 couples to a battery monitor 304. The battery monitor 304 monitors the status of a battery 306. The status of the battery can pertain to one more attributes on the battery 306. For example, one attribute of the battery 306 is charge level, such as percentage charged. Other attributes of the battery 306, which additionally or alternatively could be monitored, include temperature, voltage or current. The battery monitor 304 monitors the status of the battery 306 and reports a battery status to the device status manager 302. The device status manager 302 can then store the current status of the battery 306. The device status manager 302 can then utilize the current status of the battery 306 to provide user information regarding the battery status. The status information provided to a user can be in either an audio form, a visual form, or both. When the device status manager 302 provides audio status information, the device status manager 302 provides an audio status output. On the other hand, when the device status manager 302 provides visual status information, the device status manager 302 outputs a visual status output.

In addition, the device status monitoring system 300 can utilize preference settings 308 and/or user requests 310 in monitoring one or more devices that are internal to the electronic device. The preference settings 308 can be supplied to the device status manager 302 to affect the status information being provided by the device status monitoring system 300. For example, the preference settings 308 can influence the type of status information being provided, the timing at which the status information is provided, and the criteria on which the status information is based. As a particular example, a preference setting can allow a user to enable/disable output of auditory device status. The user requests 310 can pertain to user inputs, such as input buttons, that enable the user to request that device status (e.g., battery status) be provided.

In general, the device status can be initiated by a user or performed automatically. A user can request the device status by pressing a button on the electronic device. Alternatively or additionally, the electronic device itself can automatically output the device status. For example, the device status can be output when the device status is undesirable (e.g., battery charge level low). As another example, the device status can be output when an event occurs, such as the device is turned on, after a predetermined number of songs have played, etc.

As noted above, the device status can be output in an audible manner. In one embodiment, the device status is provided by an audio snippet.

As one example, the audio snippet can be a voice (i.e., spoken or synthesized voice). In the case of a global electronic device, use of voice may present localization issues due to the many different languages in use.

As another example, the audio snippet can include a series of tones or notes. In one example, the number of tones played in a sequence indicates its charge level (e.g., 1 note, low charge; n notes, fully charged). These tones or notes can be different tones or notes which follow a scale. The scale can, for example, be a raising scale (e.g., major scale). Scales in traditional Western music typically consist of seven notes, made up of a root note and six other scale degrees whose pitches lie between the root and the root's first octave. For example, the device status (i.e., battery charge level) can be presented to the user of the audio snippet using a scale. The higher up the scale the audio snippet goes, the greater the charge level of the battery. In one implementation, a top note of the scale can be output first before some or all of the notes of the scale are played to indicate device status. Outputting the top note first can provide the user context or a reference point so that they better understand the extent of the scale being output as indicating a degree of device status. In another implementation the entire scale could be output first before some or all of the notes of the scale are played to indicate device status.

As still another example, a pair of notes can be used to indicate device status (i.e., battery charge level). Here, the interval separation between the two notes can indicate intensity. If the two notes are same, the battery is substantially half charged. If the notes are rising, the battery is deemed substantially charged. If the notes are falling, the battery is deemed substantially discharged. In still another embodiment, the audio snippet can be a sliding scale (i.e., without discrete tones). The distance up the scale indicates the charge level.

In yet still another embodiment, chords can be used. Typically, a chord has 13 notes. Each of these 13 notes can be used to convey a battery charge level.

Although use of notes, scales and chords are used to symbolically indicate device status. In another embodiment, other symbolic approaches can be used. For example, the sound of filling a container with a liquid. Another example is controlling a playback rate of an audio snippet.

In one embodiment, the electronic device, i.e., portable media device, makes use of a graphical user interface to assist the user with configuring device status output preferences. For example, the user may desire to have device status presented in a visual manner. Alternatively, or in addition, the user may desire device status be provided in an audio manner via an earphone or headphone.

Figure 4:
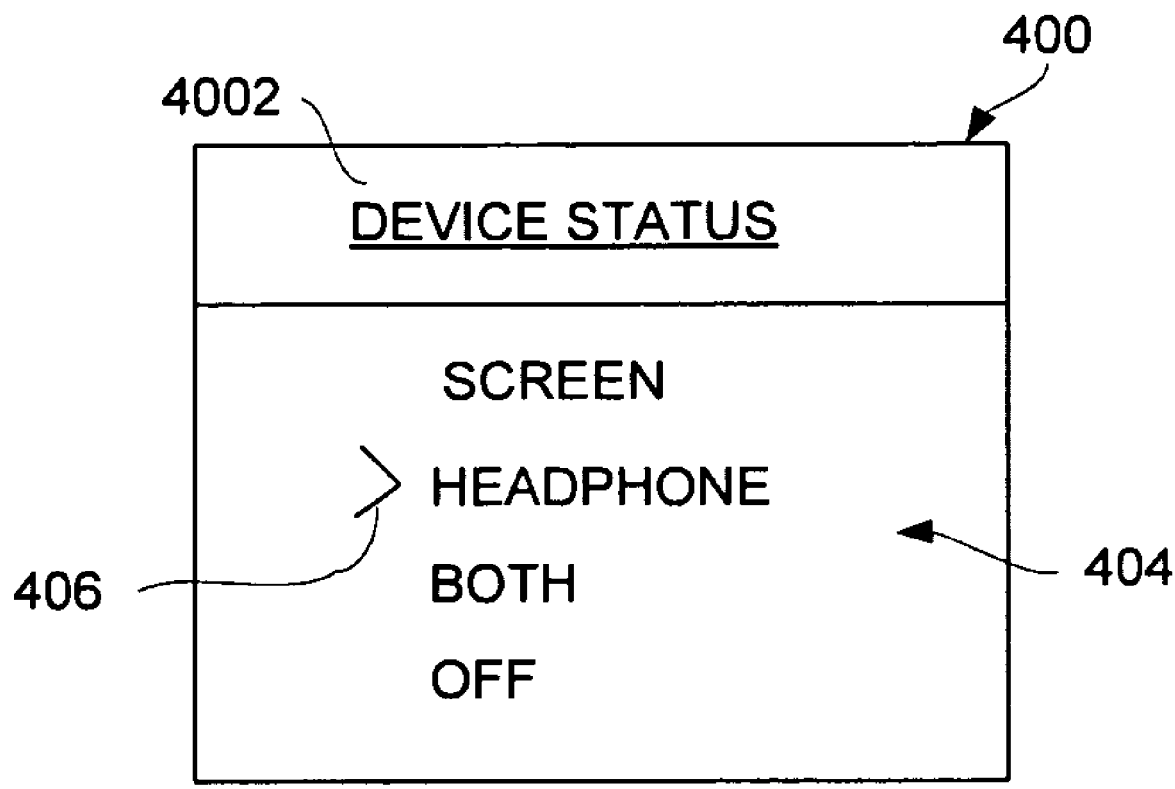
FIG. 4 illustrates a graphical user interface according to one embodiment of the invention.

FIG. 4 illustrates a graphical user interface 400 according to one embodiment of the invention. The graphical user interface 400 allows a user to configure a portable media device for visual and/or auditory delivery of device status. More particularly, the graphical user interface 400 includes a header or title 402 designating that the graphical user interface pertains to "Device Status". The graphical user interface 400 also displays a menu or list 404 of user selectable items. In this example, the menu or list 404 includes four user selectable items, namely, "Screen", "Headphone", "Both" and "Off". The "Screen" selection causes the configuration to provide visual delivery of status information via a display screen. The "Headphone" selection causes the configuration to provide auditory delivery of status information via earphone(s) or headphone(s) (e.g., speaker 714 (external)). The "Both" selection causes the configuration to provide both auditory and visual delivery of status information. The "Off" selection causes the configuration to provide no device status information (though urgent status condition might still be provided). A selector 406 indicates current selection of the "Headphone" item.

Figure 5:
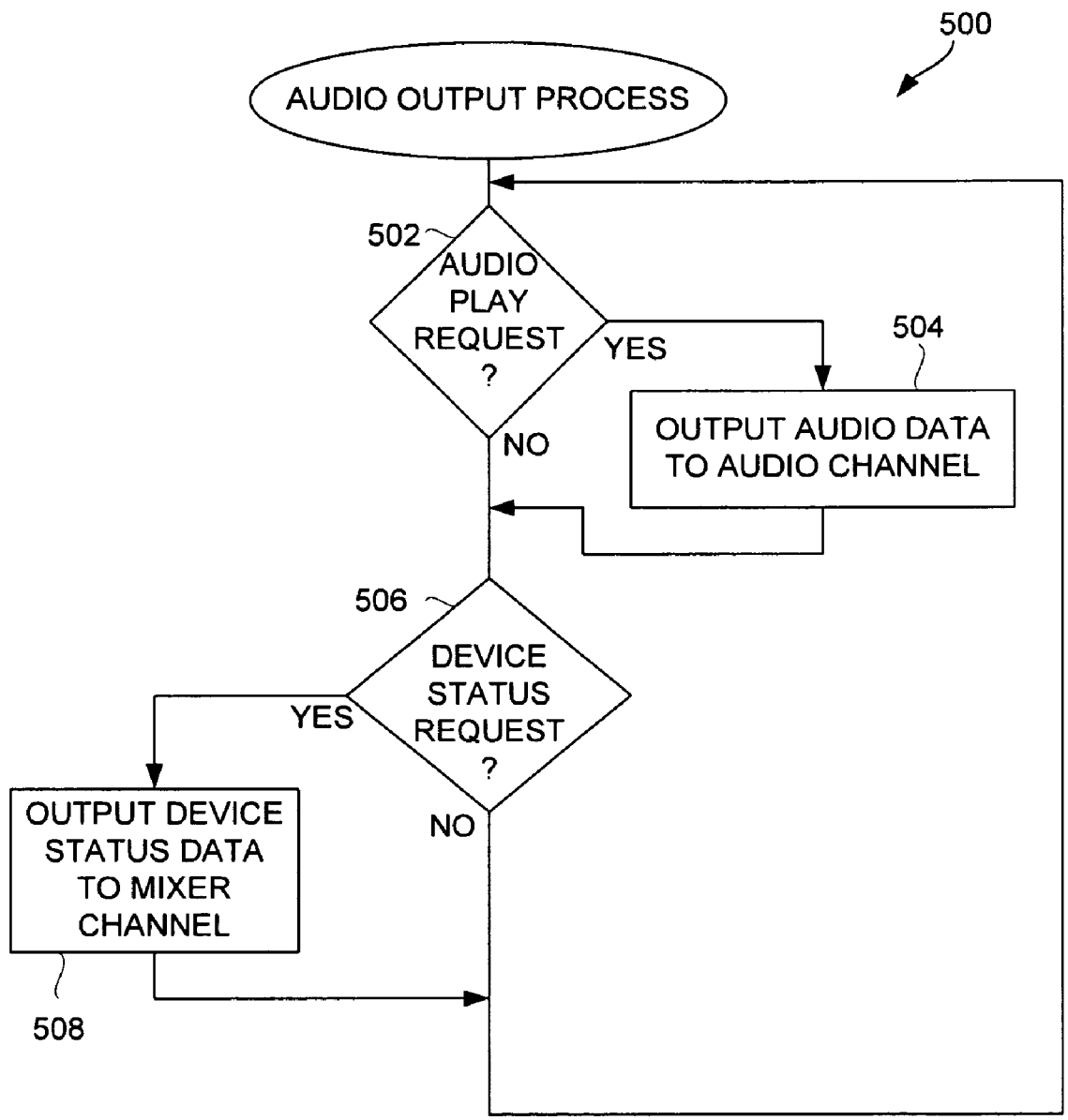
FIG. 5 is a flow diagram of an audio output process according to one embodiment of the invention.

FIG. 5 is a flow diagram of an audio output process 500 according to one embodiment of the invention. The audio output process 500 is performed by an electronic device, namely, a portable media device, that can play media items.

The audio output process 500 begins with a decision 502 that determines whether an audio play request has been issued. For example, an audio play request can be issued as a result of a system action or a user action with respect to the portable media device. When the decision 502 determines that an audio play request has been issued, audio data is output 504 to an audio channel. By outputting the audio data to the audio channel, the audio data is directed to an audio output device, namely, a speaker, wherein audible sound is output.

Following the operation 504, or following the decision 502 when an audio play request has not been issued, a decision 506 determines whether a device status request has been issued. When the decision 506 determines that a device status request has been issued, then device status data is output 508 to a mixer channel. The mixer channel allows the device status data to mix with the audio data on the audio channel. After the device status data has been output 508 to the mixer channel, or directly following the decision 506 when a device status request has not been issued, the audio output process 500 returns to repeat the decision 502 and subsequent operations so that subsequent requests can be similarly processed.

It should be understood that often audio data is output for a longer duration than is any device status data, which tends to be of a shorter duration (e.g., audio snippet). Hence, during the output of the audio data to the audio channel, device status data for one or more devices can be output to the mixer channel and thus combined with the audio data.

Figure 6:
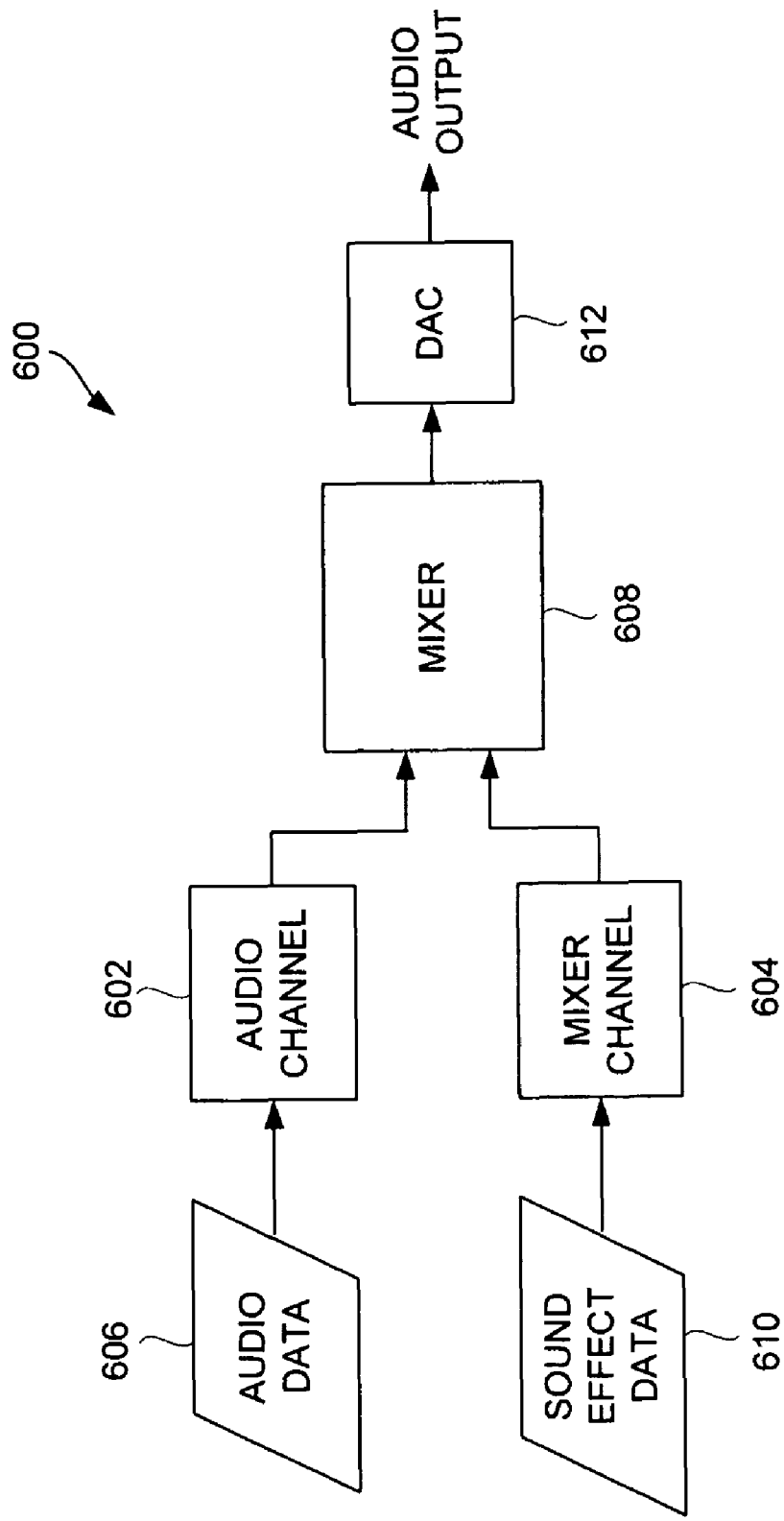
FIG. 6 is a block diagram of an audio processing system according to one embodiment of the invention.

FIG. 6 is a block diagram of an audio processing system 600 according to one embodiment of the invention. The audio processing system 600 includes an audio channel 602 and a mixer channel 604. The audio channel 602 typically includes a decoder and a buffer. The mixer channel 604 typically includes resolution and/or sample rate converters. Additional details on mixer channels and mixing are described in U.S. patent application Ser. No. 11/144,541, filed Jun. 3, 2005, and entitled "TECHNIQUES FOR PRESENTING SOUND EFFECTS ON A PORTABLE MEDIA PLAYER", which is hereby incorporated herein by reference.

The audio channel 602 receives audio data 606 that is to be output by the audio processing system 600. After the audio data 606 passes through the audio channel 602, it is provided to a mixer 608. The mixer channel 604 receives device status data 610. After the device status data 610 has passed through the mixer channel 604, it is provided to a mixer 608. The mixer 608 serves to combine the audio data from the audio channel 602 with the device status data 610 from the mixer channel 604. The combined data is then supplied to a Digital-to-Analog Converter (DAC) 612. The DAC 612 converts the combined data to an analog audio output. The analog audio output can be supplied to an audio output device, such as a speaker.

The electronic device as described herein can be a media device (e.g., media player) capable of playing (including displaying) media items. The media items can pertain to audio items (e.g., audio files or songs), videos (e.g., movies) or images (e.g., photos).

Figure 7:
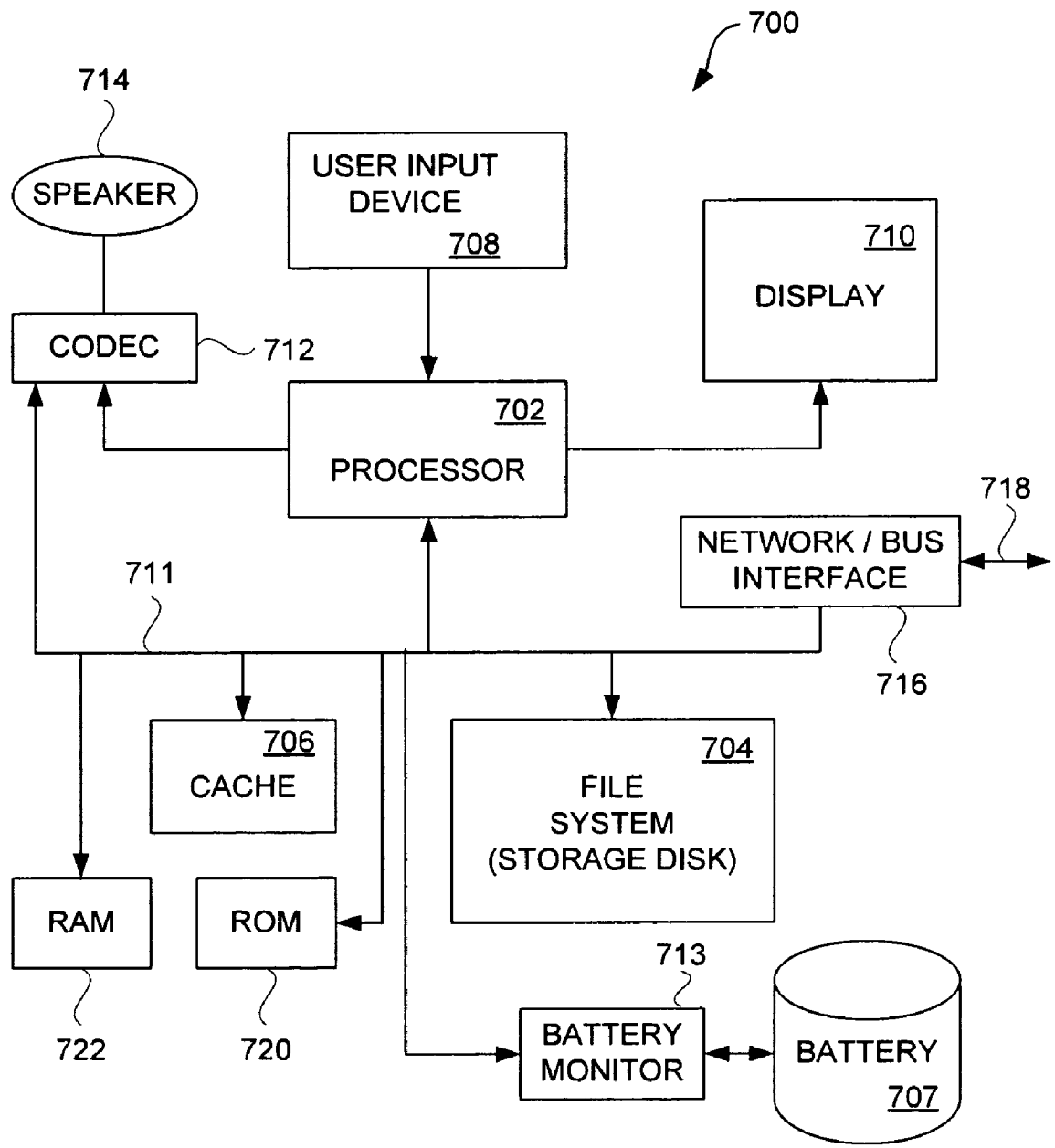
FIG. 7 is a block diagram of a media player according to one embodiment of the invention.

FIG. 7 is a block diagram of a media player 700 according to one embodiment of the invention. The media player 700 can include the circuitry of the device status monitoring system 300 in FIG. 3 or the audio processing system 600 in FIG. 6, and/or can perform the operations described with reference to FIGS. 1, 2A, 2B and 5.

The media player 700 includes a processor 702 that pertains to a microprocessor or controller for controlling the overall operation of the media player 700. The media player 700 stores media data pertaining to media items in a file system 704 and a cache 706. The file system 704 is, typically, a storage disk or a plurality of disks. The file system 704 typically provides high capacity storage capability for the media player 700. The file system 704 can store not only media data but also non-media data (e.g., when operated in a disk mode). However, since the access time to the file system 704 is relatively slow, the media player 700 can also include a cache 706. The cache 706 is, for example, Random-Access Memory (RAM) provided by semiconductor memory. The relative access time to the cache 706 is substantially shorter than for the file system 704. However, the cache 706 does not have the large storage capacity of the file system 704. Further, the file system 704, when active, consumes more power than does the cache 706. The power consumption is often a concern when the media player 700 is a portable media player that is powered by a battery 707. The media player 700 also includes a RAM 720 and a Read-Only Memory (ROM) 722. The ROM 722 can store programs, utilities or processes to be executed in a non-volatile manner. The RAM 720 provides volatile data storage, such as for the cache 706.

The media player 700 also includes a user input device 708 that allows a user of the media player 700 to interact with the media player 700. For example, the user input device 708 can take a variety of forms, such as a button, keypad, dial, etc. In one implementation, the user input device 708 can be provided by a dial that physically rotates. In another implementation, the user input device 708 can be implemented as a touchpad (i.e., a touch-sensitive surface). In still another implementation, the user input device 708 can be implemented as a combination of one or more physical buttons and well as a touchpad. Still further, the media player 700 includes a display 710 (screen display) that can be controlled by the processor 702 to display information to the user. A data bus 711 can facilitate data transfer between at least the file system 704, the cache 706, the processor 702, and the CODEC 712.

The media player 700 also provides status monitoring of one or more devices within the media player 700. One device of the media player 700 that can be monitored its the battery 707. In this regard, the media player 700 includes a battery monitor 713. The battery monitor 713 operatively couples to the battery 707 to monitor is conditions. The battery monitor 713 can communicate battery status (or conditions) with the processor 702. The processor 702 can cause an audio output (e.g., audio snippet) via the speaker 714 so as to inform the user of the media player 707 of the battery status. Another device of the media player 700 that could be monitored is the network/bus interface 718, for example, to provide an audio indication of bus/network speed.

In one embodiment, the media player 700 serves to store a plurality of media items (e.g., songs) in the file system 704. When a user desires to have the media player play a particular media item, a list of available media items is displayed on the display 710. Then, using the user input device 708, a user can select one of the available media items. The processor 702, upon receiving a selection of a particular media item, supplies the media data (e.g., audio file) for the particular media item to a coder/decoder (CODEC) 712. The CODEC 712 then produces analog output signals for a speaker 714. The speaker 714 can be a speaker internal to the media player 700 or external to the media player 700. For example, headphones or earphones that connect to the media player 700 would be considered an external speaker. The speaker 714 can not only be used to output audio sounds pertaining to the media item being played, but also to output audio sounds pertaining to device status. A plurality of device status options can be stored as audio data on the media player 700, such as in file system 704, the cache 706, the ROM 720 or the RAM 722. The audio data for the device status options can be stored in a wide variety of formats. For example, audio data for the device status options can be simply Pulse Coded Modulation (PCM) data or can be encoded data, such as MP3 or MPEG-4 format. PCM data is typically either raw data (e.g., a block of samples) or formatted (e.g., WAV or AIFF file formats).

A device status can be output in response to a user input or a system request. When a particular device status is to be output to the speaker 714, the associated audio data for the device status can be retrieved by the processor 702 and supplied to the CODEC 712 which then supplies audio signals to the speaker 714. In the case where audio data for a media item is also being output, the processor 702 can process the audio data for the media item as well as the device status. In such case, the audio data for the device status can be mixed with the audio data for the media item. The mixed audio data can then be supplied to the CODEC 712 which supplies audio signals (pertaining to both the media item and the device status) to the speaker 714.

The media player 700 also includes a network/bus interface 716 that couples to a data link 718. The data link 718 allows the media player 700 to couple to a host computer. The data link 718 can be provided over a wired connection or a wireless connection. In the case of a wireless connection, the network/bus interface 716 can include a wireless transceiver.

In one embodiment, the media player 700 is a portable computing device dedicated to processing media such as audio. For example, the media player 700 can be a music player (e.g., MP3 player), a game player, and the like. These devices are generally battery operated and highly portable so as to allow a user to listen to music, play games or video, record video or take pictures wherever the user travels. In one implementation, the media player 700 is a handheld device that is sized for placement into a pocket or hand of the user. By being handheld, the media player 700 is relatively small and easily handled and utilized by its user. By being pocket sized, the user does not have to directly carry the device and therefore the device can be taken almost anywhere the user travels (e.g., the user is not limited by carrying a large, bulky and often heavy device, as in a portable computer). Furthermore, the device may be operated by the user's hands, no reference surface such as a desktop is needed.

Figure 8:
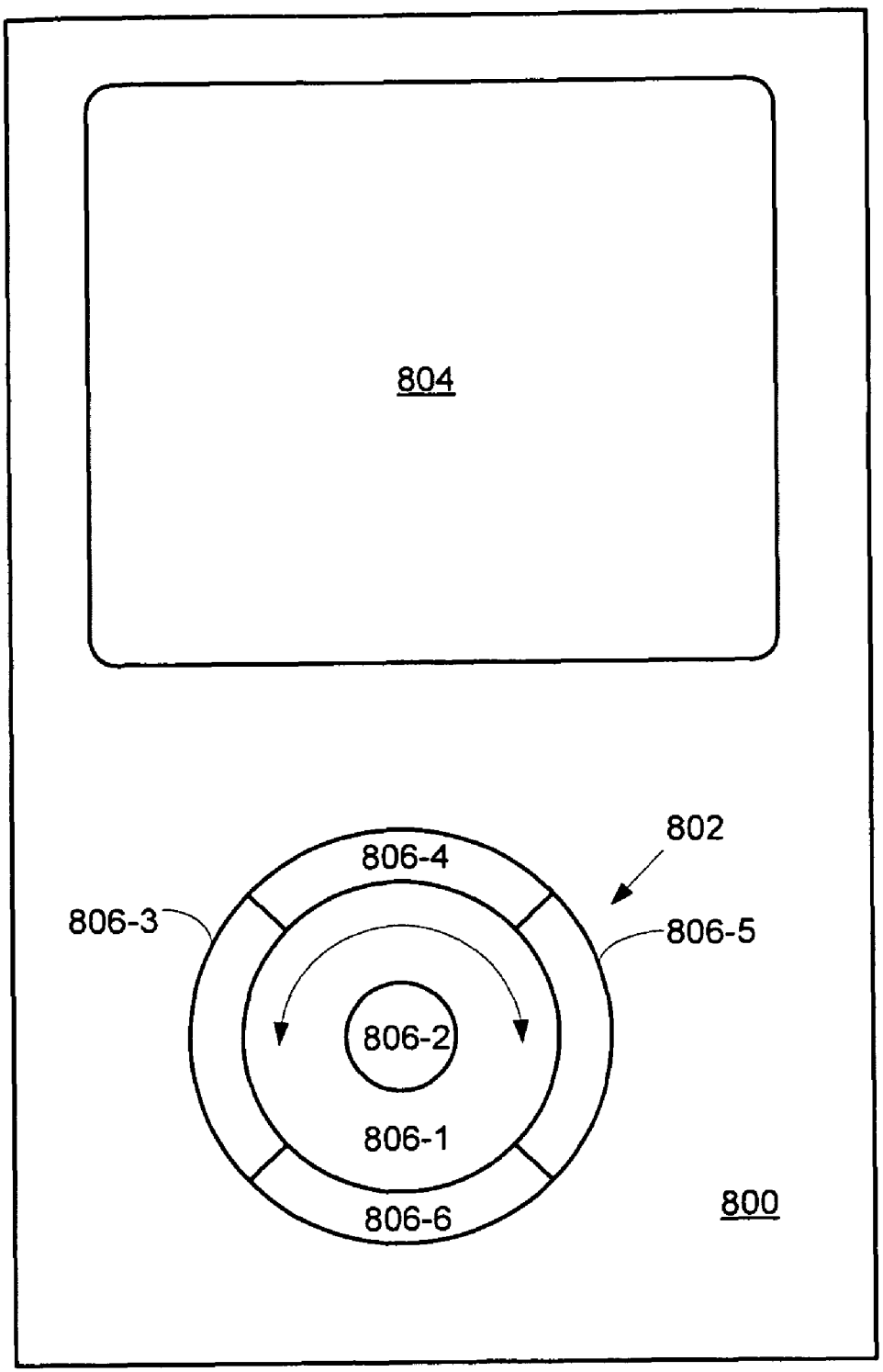
FIG. 8 illustrates a media player having a particular user input device according to one embodiment of the invention.

The user input device 708 can take a variety of forms, such as a button, keypad, dial, etc. (physical or soft implementations) each of which can be programmed to individually or in combination to perform any of a suite of functions. FIG. 8 illustrates a media player 800 having a particular user input device 802 according to one embodiment. The media player 804 can also include a display 804. The user input device 802 includes a number of input devices 806, which can be either physical or soft devices. Such input devices 806 can take the form of a rotatable dial 806-1, such as in the form of a wheel, capable of rotation in either a clockwise or counterclockwise direction. A depressible input button 806-2 can be provided at the center of the dial 806-1 and arranged to receive a user input event such as a press event. Other input buttons 806 include input buttons 806-3 through 806-6 each available to receive user supplied input action.

As noted above, the audio system can be utilized to mix sound effects with player data such that the mixed audio can be output to an audio output device. The audio system can be system or user configurable as to sound effect processing. For example, a user may desire sound effects to be output to a particular audio output device of the audio system. As one example, the audio output device can be an in-device speaker. As another example, a user may desire sound effects to be output to a headphone (earphone) instead of or in addition to any in-device speaker.

The invention is suitable for use with battery-powered electronic devices. However, the invention is particularly well suited for hand-held electronic devices, such as a hand-held media device. One example of a hand-held media device is a portable media player (e.g., music player or MP3 player).

Another example of a hand-held media device portable is a mobile telephone (e.g., cell phone) or Personal Digital Assistant (PDA).

One example of a media player is the iPod® media player, which is available from Apple Computer, Inc. of Cupertino, Calif. Often, a media player acquires its media assets from a host computer that serves to enable a user to manage media assets. As an example, the host computer can execute a media management application to utilize and manage media assets. One example of a media management application is iTunes®, produced by Apple Computer, Inc.

The various aspects, embodiments, implementations or features of the invention can be used separately or in any combination.

The invention is preferably implemented by software, hardware or a combination of hardware and software. The invention can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, DVDs, magnetic tape and optical data storage devices. The computer readable code can also be distributed over network-coupled computer systems so that the computer readable code is stored and executed in a distributed fashion.

The advantages of the invention are numerous. Different aspects, embodiments or implementations may yield one or more of the following advantages. One advantage of the invention is that device status can be presented to a user of an electronic device, such as a portable electronic device, in an audible manner. As a result, a user can receive device status information without having to view a display screen or other visual indicator. This can be particularly useful when there is no display screen or other visual indicator, or when the user is busy and not able to conveniently view a visual indication. The electronic device can be a media device that outputs media. Another advantage of the invention is that device status information can be output even while a media device is outputting other media (e.g., music). Still another advantage of the invention is that device status information that is output in an audio manner can be symbolic of the device status.

The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A portable audio device, comprising:
   at least one battery to provide power to electrical components included in the portable audio device;
   a memory device arranged to store at least audio data, wherein the audio data includes a plurality of audio snippets that includes at least a first audio snippet that indicates a first battery charge level and a second audio snippet that indicates a second battery charge level;
   an audio output device configured to provide audio output of media by the portable audio device; and
   a processor configured to monitor a battery charge level of the battery when the portable audio device is active and presenting the audio output, obtain the first audio snippet selected from the plurality of audio snippets stored in the memory device when the monitored battery charge level is the first battery charge level, mix the first audio snippet with the audio output to provide a mixed audio output, and output the mixed audio output, thereby providing an indication of the battery charge level without interrupting the presentation of the audio output of media by the portable audio device.

2. The portable audio device as recited in claim 1, further comprising:
a speaker, wherein the audio snippet is presented via the speaker.

3. The portable audio device as recited in claim 1, wherein the portable audio device has a speaker jack and at least one external speaker operatively connectable to the speaker jack, and wherein the audio snippet is provided to the at least one external speaker via the speaker jack.

4. A portable media device, comprising:
an audio output device;
a device status monitor that monitors a device status of the portable media device when the portable media device is active, wherein the device status includes diagnostic data pertaining to the portable media device;
a device status manager operatively connected to the device status monitor, wherein the device status monitor determines when the device status of the portable media device is to be output to the audio output device;
a first memory device for storing a plurality of device status effects that includes at least a first device status effect that indicates a first device status of the portable media device and a second device status effect that indicates a second device status of the portable media device, and media items separate from the plurality of device status effects; and
a processor for processing the first device status effect selected from the plurality of device status effects to produce a first audio status data that indicates the first device status of the portable media device for the audio output device, thereby outputting the device status of the audio output device in an audible manner, wherein the processor implements an audio processing system and also processes at least one of the media items to produce output media data for the audio output device, and wherein the audio processing system mixes the first audio status data and the output media data to provide a mixed audio output and outputs the mixed audio output to the audio output device.

5. The portable media device as recited in claim 4, wherein the diagnostic data includes error data pertaining to an error pertaining to the portable media device.

6. The portable media device as recited in claim 4, wherein the audio output device is a speaker.

7. The portable media device as recited in claim 4, wherein the audio output device is a headphone or at least one earphone.

8. A non-transitory computer readable medium storing at least computer program code for providing an indication of battery status to a user of a portable audio device including a battery and operable to present audio output of media by the portable audio device, wherein said non-transitory computer readable medium includes:
executable computer program code for monitoring a battery charge level of the battery when the portable audio device is active and presenting the audio output of media;
executable computer program code for obtaining, based on the monitoring of the battery charge level, a first audio snippet that indicates a first battery charge level selected from a plurality of audio snippets stored on the portable device that includes at least the first audio snippet and a second audio snippet that indicates a second battery charge level;
executable computer program code for mixing the first audio snippet with the audio output of media to provide a mixed output; and
executable computer program code for outputting the mixed output for the user, thereby providing an indication of the battery charge level to the user of the portable audio device without interrupting the presentation of the audio output of media by the portable audio device.

9. The non-transitory computer readable medium as recited in claim 8, wherein the audio output of media is a song being played by the portable audio output device.

10. The non-transitory computer readable medium as recited in claim 8, wherein the audio snippet is a sequence of distinct tones or notes.

11. The non-transitory computer readable medium as recited in claim 10, wherein the sequence of distinct tones or notes follow a scale.

12. The non-transitory computer readable medium as recited in claim 11, wherein the scale is a rising scale.

13. The non-transitory computer readable medium as recited in claim 8, wherein the audio snippet is a spoken voice.

14. A computer-implemented method of providing an indication of device status to a user of a portable audio output device including an internal device, the computer-implemented method comprising:
monitoring, by the portable audio output device, a device status of the internal device;
obtaining, by the portable audio output device, a first audio snippet that indicates a first device status selected from a plurality of audio snippets that includes at least the first audio snippet and a second audio snippet that indicates a second device status;
mixing, by the portable audio output device, the first audio snippet with an audio output to provide a mixed output; and
outputting, by the portable audio output device, the mixed output to the user, thereby providing an indication of the device status to the user of the portable audio output device without interrupting presentation of the audio output.

15. The computer-implemented method as recited in claim 14, wherein the audio output pertains to a song being played by the portable audio output device.

16. The computer-implemented method as recited in claim 14, wherein the audio snippet is a sequence of distinct tones or notes.

17. The computer-implemented method as recited in claim 10, wherein the sequence of distinct tones or notes follow a scale.

18. The computer-implemented method as recited in claim 17, wherein the scale is a rising scale.

19. The computer-implemented method as recited in claim 14, wherein the audio snippet is a spoken voice.

* * * * *